(12) United States Patent
Pasotti et al.

(10) Patent No.: US 6,195,289 B1
(45) Date of Patent: Feb. 27, 2001

(54) DEVICE FOR READING ANALOG NONVOLATILE MEMORY CELLS, IN PARTICULAR FLASH CELLS

(75) Inventors: Marco Pasotti, S. Martino Siccomario; Roberto Canegallo, Tortona; Giovanni Guaitini, Trecella; Pier Luigi Rolandi, Monleale, all of (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 0 days.

(21) Appl. No.: 09/425,446

(22) Filed: Oct. 22, 1999

Related U.S. Application Data

(63) Continuation-in-part of application No. 09/121,024, filed on Jul. 22, 1998, now Pat. No. 5,973,959.

(30) Foreign Application Priority Data

Oct. 23, 1998 (IT) .............................. TO98A0906

(51) Int. Cl.[7] .................................................. G11C 16/06
(52) U.S. Cl. ............................... 365/185.21; 365/185.03; 365/185.2; 365/185.33
(58) Field of Search ........................... 365/185.2, 185.21, 365/185.22, 185.33, 185.03, 185.18

(56) References Cited

U.S. PATENT DOCUMENTS

| | | | |
|---|---|---|---|
| 5,796,655 | * 8/1998 | Reed et al. | 365/185.22 |
| 5,909,393 | * 6/1999 | Tran et al. | 365/185.2 |
| 5,973,959 | * 10/1999 | Gerna et al. | 365/185.03 |
| 5,982,662 | * 11/1999 | Kobayashi et al. | 365/185.03 |
| 6,018,477 | * 1/2000 | Wang | 365/185.25 |

* cited by examiner

*Primary Examiner*—Son Mai
(74) *Attorney, Agent, or Firm*—Theodore E. Galanthay; Robert Iannucci; Seed IP Law Group, PLLC

(57) ABSTRACT

A read device comprises a sense amplifier having an input connected to a data memory cell to be read and an output issuing a signal correlated to the threshold voltage of the data memory cell. A first and second voltage sources circuit have respect first and second outputs that supply respective first and a second input reference voltage. A resistive divider connected between the first and the second outputs of the voltage source circuits has a plurality of outputs supplying respective intermediate reference voltages having values between the first and the second input reference voltages. A plurality of comparator circuits have a first input connected to the output of the sense amplifier, a second input connected to a respective output of the resistive divider, and an output supplying a digital signal indicative of the outcome of a respective comparison. Each voltage source circuit comprises a nonvolatile reference memory cell of the same type as the data memory cell and having an own threshold voltage correlated to the input reference voltage, supplied by the voltage source circuit. Thereby, the input reference voltages, and thus the intermediate reference voltages supplied to the comparator circuits, undergo variations in time correlated to the voltage supplied by the sense amplifier and consequent on the variations of the threshold voltages of the data memory cells.

23 Claims, 2 Drawing Sheets

DEVICE FOR READING ANALOG NONVOLATILE MEMORY CELLS, IN PARTICULAR FLASH CELLS

CROSS-REFERENCE TO RELATED APPLICATION

This application is a continuation-in-part of U.S. patent application Ser. No. 09/121,024, filed Jul. 22, 1998, which issued as U.S. Pat. No. 5,973,959.

TECHNICAL FIELD

The present invention regards a device for reading analog nonvolatile memory cells, in particular flash cells.

BACKGROUND OF THE INVENTION

As known, analog nonvolatile memory cells are currently read by a reading device comprising a sense amplifier and an analog/digital (A/D) converter. In detail, the sense amplifier is connected to the memory cell to be read and generates an output voltage having an amplitude correlated to the value of the current flowing in the memory cell during reading, and thus correlated to the threshold voltage of the memory cell. The A/D converter receives at the input the output voltage generated by the sense amplifier and supplies at the output a binary word associated to the threshold voltage of the memory cell.

Specifically, the A/D converter comprises a plurality of comparator circuits receiving at a first input the output voltage of the sense amplifier, and at a second input different preset reference values, typically defined by a resistive divider receiving at the input a first and a second reference voltages defining the conversion range and the value of the least significant bit of the output binary word.

The reference voltages for the A/D converter are generated inside the chip accommodating the A/D converter, for example by temperature compensated regulator circuits, or are supplied from outside. In both cases, however, the reference voltages supplied to the A/D converter are completely uncorrelated with the variations in time in the output voltage of the sense amplifier, which are mainly due to the variation in the threshold voltage of the memory cell. In certain cases, this may cause reading errors of the memory cell.

SUMMARY OF THE INVENTION

The reference voltage source circuit includes a nonvolatile memory cell having a threshold value thereon. The threshold value is selected to provide a desired reference voltage value or values. Any reference value therefore tracks changes in the stored threshold values of the memory cells in the array.

According to the present invention, there is provided a device for reading analog nonvolatile memory cells having a reference voltage source circuit.

BRIEF DESCRIPTION OF THE DRAWINGS

For a better understanding of the present invention, a preferred embodiment is now described, purely to present a non-limiting example and with reference to the attached drawings, wherein.

DETAILED DESCRIPTION OF THE INVENTION

Figure 1:
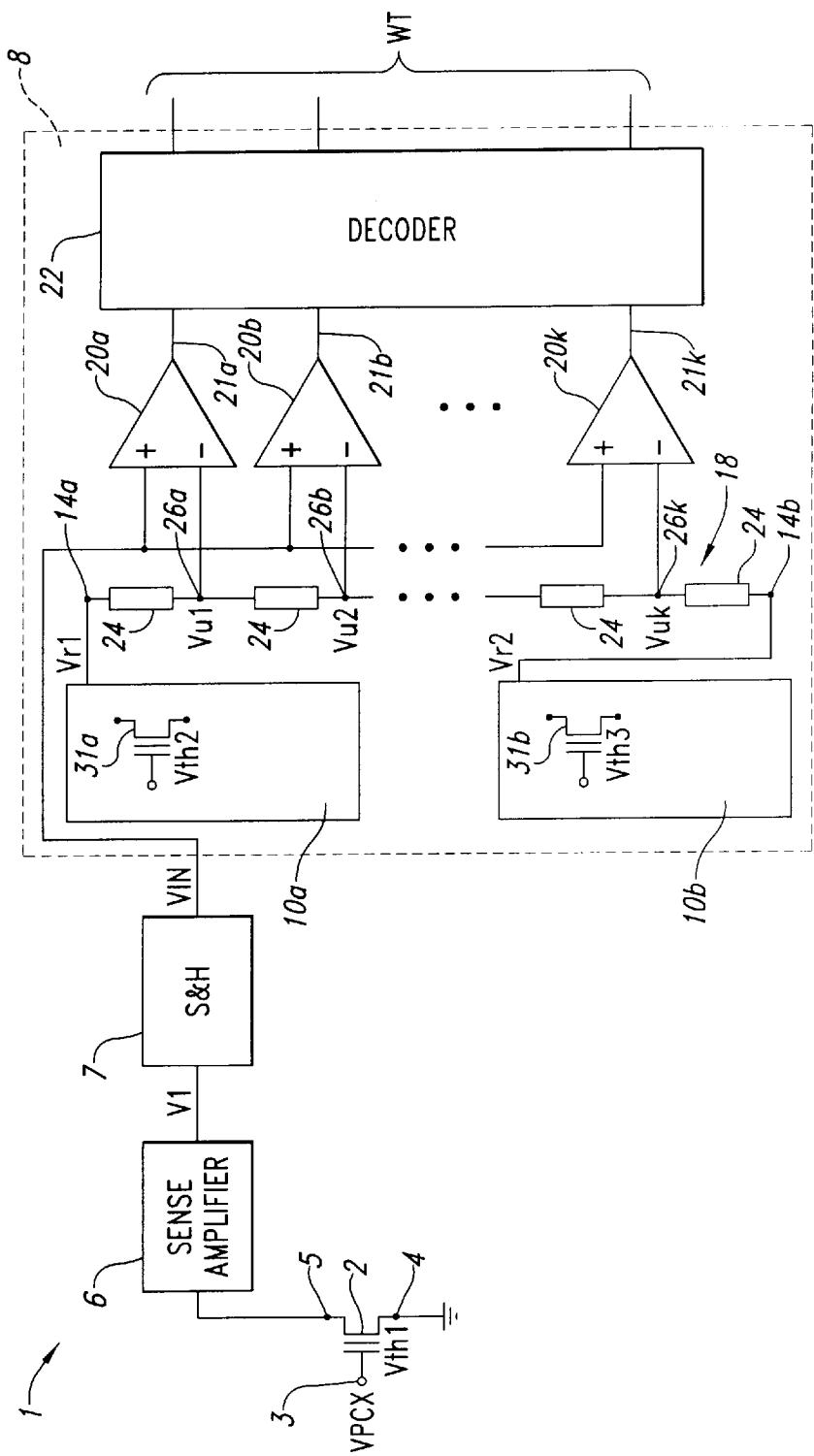
FIG. 1 shows a circuit diagram of a reading device according to the present invention.

In FIG. 1, a device for reading a data memory cell 2, for example, a flash-EEPROM cell, is indicated, as a whole, at 1.

In particular, the data memory cell 2 has a gate terminal 3 receiving a read voltage VPCX, a source terminal 4 connected to ground, and a drain terminal 5 connected to the input of the reading device 1.

The reading device 1, having the aim of supplying at the output an output binary word WT correlated to the threshold voltage Vth1 of the data memory cell 2, comprises a sense amplifier 6, a sample and hold circuit 7, hereinafter indicated as S/H circuit 7, and an A/D (analog/digital) converter 8.

The sense amplifier 6 has an input connected to the drain terminal 5 of the data memory cell 2 and an output supplying a voltage V1 having an amplitude correlated to he value of the current flowing in the data memory cell 2 during reading, and thus correlated to the threshold voltage Vth1 of the data memory cell 2. The sense amplifier is of known type and is, for example, described in the Patent Application EP-A-0833348 in the name of the present applicant.

The S/H circuit 7, of a known type, has an input connected to the output of the sense amplifier 6 and receives therefrom voltage V1, and an output supplying an input voltage VIN having a value equal to that of voltage V1 at sampling.

The A/D converter 8 has an input connected to the S/H circuit 7 and receives therefrom the input voltage VIN, and an output supplying the output binary word WT.

The A/D converter 8 comprises two voltage source circuits 10a, 10b, each having an output, 14a, respectively 14b, and supplying a first input reference voltage Vr1, and, respectively, a second input reference voltage Vr2, with Vr1>Vr2; a resistive divider 18 generating a plurality of intermediate reference voltages Vu1, Vu2, . . . , Vuk comprised between the input reference voltages Vr1 and Vr2; a plurality of comparator circuits 20a, 20b, . . . , 20k comparing the input voltage VIN with the intermediate reference voltages Vu1–Vuk; and a decoder circuit 22 generating the output binary word WT.

In particular, the resistive divider 18 is formed by a plurality of resistors 24 connected in series between the outputs 14a, 14b of the voltage source circuits 10a, 10b; the resistors 24 define a plurality of intermediate nodes 26a, 26b, . . . , 26k, supplying the intermediate reference voltages Vu1–Vuk having values comprised between those of the input reference voltages Vr1, Vr2.

The comparator circuits 20a–20k have a first input receiving the input voltage VIN, a second input connected to a respective intermediate node 26a–26k of the resistive divider 18, and a respective output 21a, 21b, . . . , 21k generating a respective digital signal having a high or low logic status indicating the outcome of the comparison.

The decoder circuit 22 is connected at the inputs of the comparator circuits 20a–20k and has a plurality of outputs supplying the output binary word WT associated to he input voltage VIN, according to the logic status assumed by the output signals of the comparator circuits 20a–20k.

Figure 2:
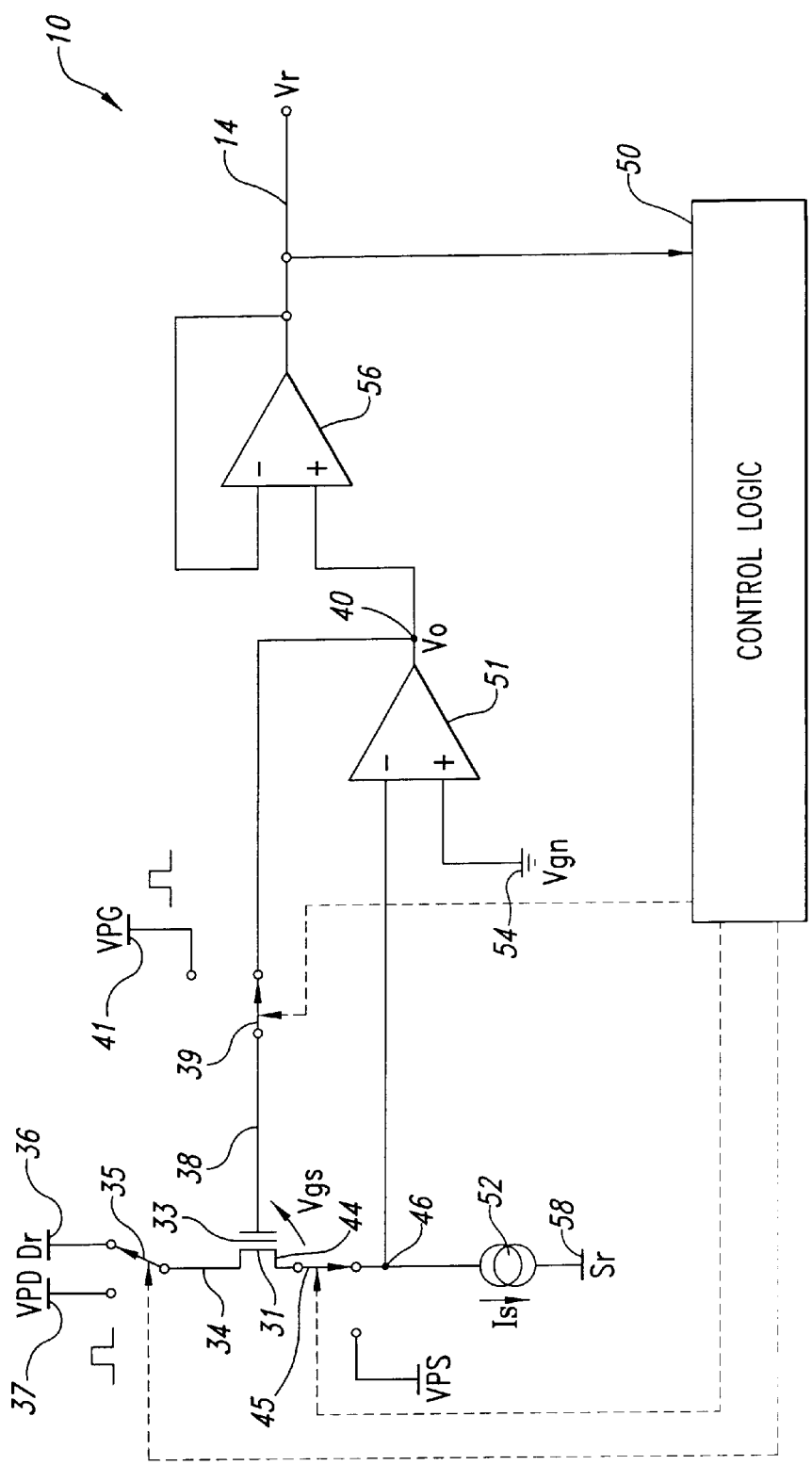
FIG. 2 shows a circuit diagram of a component of the device of FIG. 1.

The voltage source circuits 10a, 10b use nonvolatile memory cells, for example flash cells, for generating the input reference voltages Vr1, Vr2, as represented in FIG. 2 by reference memory cells 31a, 31b having threshold voltages Vth2 and Vth3, respectively.

The voltage source circuits 10a, 10b have identical circuit structures and can be made as described in EP-A-0833347 and shown here, for better understanding, with reference to FIG. 2, wherein the voltage source circuit is generically indicated at 10, and the reference memory cell at 31.

According to FIG. 2, the reference memory cell 31, of the same type as the data memory cell 2, for example of the flash-EEPROM type, has a floating gate region 33 (shown only schematically in the figure) storing the electric charge determining the threshold voltage Vth; a drain terminal 34 connected to a switch 35 which, in a first position, connects the drain terminal 34 to a reference potential line 36 set at the voltage Dr and, in a second position, to a first programming line 37 set at the voltage VPD; a gate terminal 38 connected to a switch 39 which, in a first position, connects the gate terminal 38 to a node 40 and, in a second position, to a second programming line 41 set at the voltage VPG; and a source terminal 44 connected to a switch 45 which, in a first position, connects the source terminal 44 to a node 46 and, in a second position, to a voltage VPS which, during programming, is 0 V (ground line). The control terminals of the switches 35, 39, 45 (indicated only schematically in FIG. 1) are controlled by a control logic 50.

The node 46 is connected to the inverting input of a first operational amplifier 51 and to a terminal of a current source 52. The first operational amplifier 51 has a non-inverting input connected to a reference line 54 set at voltage Vgn (for example, ground) and an output connected to the node 40, at voltage Vo. The current source 52, generating a current IS, has its second terminal connected to a reference line 58 set at voltage Sr lower than Vgn; in particular, if voltage Vgn is 0 V (ground line), voltage Sr is negative, for example −250 mV.

The output of the first operational amplifier 51 is connected to the noninverting input of a second operational amplifier 56 completely fedback (having the inverting input connected to the output); the output of the second operational amplifier 56—defining the output 14 of the voltage source circuit 10—supplies an input reference voltage Vr, supplied to the resistive divider 18 and having a value equal to that of the voltage Vo.

The operation of each voltage source circuit 10 will now be described only as regards generating the reference voltage Vr and neglecting programming of the reference memory cell 31 controlled by the control logic 50, in that it does not regard the present invention.

It is assumed initially that switches 35, 39 and 45 are in the shown positions. In addition, threshold VTH of the reference memory cell 31 is defined as the gate voltage (measured with respect to ground) that causes the current IS set by the current source 52 to flow in the reference memory cell 31.

The current ID flowing in the reference memory cell 31 is given, in first approximation, by $$ID = K(Vgs - Vth)^2 \quad (1)$$

wherein K is a constant due to the fabrication process, Vgs is the gate-to-source voltage drop, and Vth is the threshold voltage at which the reference memory cell 31 turn on (at a theoretically zero current).

With the shown circuit, the current ID in the reference memory cell 31 must be equal to the current IS imposed by the source 52 (ID=IS), and hence the overdrive voltage Vov of the reference memory cell 31 is fixed and equal to Vov=Vgs−Vth; in addition, with Vgn=0 V and at equilibrium, the voltage VS at the source terminal 44 of the reference memory cell 31, imposed by the closed-loop connection of the operational amplifier 51, is also equal to zero. In this situation, the output voltage Vo of the first operational amplifier 51, equal to the gate voltage value of the reference memory cell 31, with respect to ground, is equal to the drop Vgs of the cell, i.e., to the sum of the threshold voltage Vth of the cell and the overdrive voltage Vov determined by Eq. (1). Thus $$Vo = Vov + Vth.$$

Consequently, according to the threshold definition VTH indicated above, Vo=VTH.

The second operational amplifier 56 supplies at its output 14 a voltage Vr equal to the voltage Vo.

Consequently, an analog voltage present on the output 14 has a value equal to the cell programmed threshold VTH and can be set and modified by varying the amount of charge stored in the floating gate 33 region of the reference memory cell 31.

Consequently, in the circuit of FIG. 1, using the voltage source circuits 10a, 10b shown in FIG. 2 and described above, it is possible to generate reference voltages Vr1 and Vr2 having variations in time linearly linked to the variations in time of the threshold voltages Vth2, Vth3 of the respective reference memory cells 31a, 31b.

In fact, it has been experimentally verified that the variation in the threshold voltage of a memory cell is approximately proportional to the value of the threshold voltage, and thus, since the first input reference voltage Vr1 is higher than the second input reference voltage Vr2, the first input reference voltage Vr1 has a variation in time greater than that of the second input reference voltage Vr2. Consequently, using a resistive divider 18 formed by $2^n$ identical resistors 24, where n is the number of bits of the output binary word WT supplied by the A/D converter 8, and indicating by Δ1 the variation in the first input reference voltage Vr1 and by Δ2 the variation in the second input reference voltage Vr2, with Δ1>Δ2, the variation in the ith intermediate reference voltage Vui generated by the resistance divider 18 is $$\Delta Vui = (\Delta 1 - \Delta 2) * (i/2^n)$$

From the above relation it is therefore evident that also the intermediate reference voltages Vu1–Vuk supplied to the comparator circuits 20a–20k vary by a proportional amount to their initial values, similarly to what occurs for the data memory cells 2 to be read through the A/D converter 8.

Thereby, the A/D converter carries out a sort of automatic compensation of the variation over time of the input voltage VIN consequent on the threshold voltage variations of the data memory cells. In fact, the use of voltage sources 10a, 10b comprising reference memory cells, the threshold voltage of which varies in the same way as for the data memory cells, causes the intermediate reference voltages Vu1–Vuk to vary in a way that is correlated to that of the input voltage VIN.

In addition, by using voltage source circuits 10a, 10b of the above described type temperature compensated regulator circuits are no more necessary, with consequent simplification of the architecture of the reading devices.

Finally, it is clear that modifications and variants can be made to the read device described herein without thereby departing from the scope of the present invention.

For example, for generating the first and of the second input reference voltages Vr1 and Vr2, instead of using two voltage source circuits comprising, each, a corresponding reference memory cell, it is possible to use a single reference memory cell and two amplifier circuits, both connected to the reference memory cell, having different amplification coefficients and generating the first input reference voltage Vr1 and the second input reference voltage Vr2 as a function of the threshold voltage of the single reference memory cell.

What is claimed is:

1. A reading device for reading analog nonvolatile memory cells, comprising:
   a sense amplifier having an input connected to a data memory cell and an output;
   a plurality of comparator circuits each having a first input connected to said output of said sense amplifier, a second input, and an output;
   a voltage source circuit having a first and a second output supplying respective first and second output reference voltages, the voltage source circuit including a nonvolatile reference memory cell; and
   a resistive divider connected between said first and second outputs of said voltage source circuit and having a plurality of intermediate nodes each connected to a respective second input of said comparator circuits.

2. A reading device according to claim 1, wherein said voltage source circuit comprises first and second voltage source circuits comprising respective first and second nonvolatile reference memory cells having different threshold values.

3. A reading device according to claim 2, wherein said nonvolatile reference memory cells are flash-EEPROM cells.

4. A reading device according to claim 2 wherein said nonvolatile reference memory cells each have a drain terminal, a gate terminal, and a source terminal, and said first and second voltage source circuits each include first and second bias circuits coupled to said drain terminal and source terminal of the respective nonvolatile reference memory cell and reading circuits for reading the respective threshold value connected to said gate and source terminals of the respective nonvolatile reference memory cell.

5. A reading device according to claim 4, wherein:
   said reading circuits each comprise a first operational amplifier having a first and a second input and an output;
   said first bias circuit comprising a first constant voltage line, and said second bias circuit comprising a constant current source setting a current flowing in said reference memory cell;
   in that said first input of said first operational amplifier being connected to a node connected to said source terminal of the respective nonvolatile reference memory cell; and
   said second input of said operational amplifier being connected to a second constant voltage line, and said output of said first operational amplifier being connected to said gate terminal of the respective nonvolatile reference memory cell.

6. A reading device according to claim 5, wherein said second terminal of said first operational amplifier is connected to ground.

7. A reading device according to claim 5 wherein said constant current source has a first terminal connected to said node and a second terminal connected to a third constant voltage line set at a negative potential with respect to said second constant voltage line.

8. An analog/digital reading device according to claim 1 further comprising a decoder circuit having a plurality of inputs connected to said outputs of said comparator circuits and a plurality of outputs generating an output binary word correlated to said input voltage.

9. An analog to digital converter, comprising:
   a plurality of comparator circuits each having first and second inputs and an output, each first input being connected to an analog input signal;
   a resistive divider connected between first and second divider inputs and having a plurality of intermediate nodes each connected to a respective one of the second inputs of said comparator circuits; and
   a voltage source circuit having first and second outputs respectively connected to the first and second divider inputs, the voltage source circuit supplying the first and second divider inputs with first and second output reference voltages, respectively, and including a reference memory cell.

10. The analog to digital converter of claim 9 wherein said reference memory cell is a flash-EEPROM cell.

11. The analog to digital converter of claim 9 wherein said reference memory cell is a first nonvolatile reference memory cell of a first voltage source circuit and the voltage source circuit further includes a second voltage source circuit comprising a second nonvolatile reference memory cell, the first and second nonvolatile memory cells having different threshold values.

12. The analog to digital converter of claim 10 wherein said nonvolatile reference memory cells each have a drain terminal, a gate terminal, and a source terminal, and said first and second voltage source circuits each include first and second bias circuits of said drain terminal and source terminal of the respective nonvolatile reference memory cell and a reading circuit that reads the respective threshold value connected to said gate and source terminals of the respective nonvolatile reference memory cell.

13. The analog to digital converter of claim 12 wherein:
   said reading circuit comprises a first operational amplifier having a first and a second input and an output;
   said first bias circuit comprises a first constant voltage line, and said second bias circuit comprises a constant current source setting a current flowing in said reference memory cell;
   said first input of said first operational amplifier is connected to a node connected to said source terminal of the respective nonvolatile reference memory cell; and
   said second input of said operational amplifier is connected to a second constant voltage line, and said output of said first operational amplifier is connected to said gate terminal of the respective nonvolatile reference memory cell.

14. The analog to digital converter of claim 13 wherein said second terminal of said first operational amplifier is connected to ground.

15. The analog to digital converter of claim 13 wherein said constant current source has a first terminal connected to said node and a second terminal connected to a third constant voltage line set at a negative potential with respect to said second constant current line.

16. The analog to digital converter of claim 9, further comprising a decoder circuit having a plurality of inputs connected to said outputs of said comparator circuits and a plurality of outputs generating an output binary word correlated to said analog input signal.

17. A method of converting an analog input signal to a digital output signal, the method comprising:
   comparing the digital input signal with a plurality of intermediate reference signals; and
   voltage dividing a reference voltage that is based on a threshold voltage of a reference memory cell to produce the intermediate reference signals.

18. The method of claim 17 wherein the reference memory cell is a first memory cell with a first threshold voltage and the method further comprises producing the reference voltage as a difference between the first threshold voltage and a second threshold voltage of a second reference memory cell.

19. The method of claim 17 wherein the reference memory cell is a flash EEPROM cell.

20. The method of claim 17, further comprising:
    biasing the reference memory cell to produce on a control terminal of the reference memory cell a control voltage equal to the threshold voltage of the reference memory cell; and
    producing the reference voltage equal to the control voltage.

21. The method of claim 20 wherein the biasing act includes setting a selected current through the reference memory cell and taking a difference between a voltage at a conductive terminal of the reference memory cell and a first constant voltage to produce a difference voltage; and feeding the difference voltage to the control terminal of the reference memory cell.

22. The method of claim 21 wherein the act of setting the selected current includes using a constant current source to set the selected current with the constant current source being connected between the reference memory cell and a second constant voltage which is less than the first constant voltage.

23. The method of claim 17, further comprising decoding comparison voltages resulting from the comparing acts.

* * * * *